US010816690B2

(12) United States Patent
Xiao et al.

(10) Patent No.: US 10,816,690 B2
(45) Date of Patent: Oct. 27, 2020

(54) RADIO FREQUENCY ANTENNA RECEIVING METHOD AND DEVICE FOR A DOWNHOLE THREE-DIMENSIONAL SCANNING NUCLEAR MAGNETIC RESONANCE IMAGER

(71) Applicant: CHINA UNIVERSITY OF PETROLEUM—BEIJING, Beijing (CN)

(72) Inventors: Lizhi Xiao, Beijing (CN); Guangzhi Liao, Beijing (CN); Wei Liu, Beijing (CN)

(73) Assignee: CHINA UNIVERSITY OF PETROLEUM-BEIJING, Beijing (CN)

( * ) Notice: Subject to any disclaimer, the term of this patent is extended or adjusted under 35 U.S.C. 154(b) by 0 days.

(21) Appl. No.: 16/238,409

(22) Filed: Jan. 2, 2019

(65) Prior Publication Data
US 2019/0277996 A1 Sep. 12, 2019

(30) Foreign Application Priority Data

Mar. 8, 2018 (CN) .......................... 2018 1 0189339

(51) Int. Cl.
*G01V 3/32* (2006.01)
*G01R 33/36* (2006.01)
(Continued)

(52) U.S. Cl.
CPC ........... *G01V 3/32* (2013.01); *G01R 33/3621* (2013.01); *H01Q 1/04* (2013.01); *H01Q 1/521* (2013.01)

(58) Field of Classification Search
CPC ............ G01V 3/32; H01Q 1/521; H01Q 1/04; H01Q 23/00; H01Q 21/00; G01R 33/3621; G01R 33/3415; G01R 33/3664
See application file for complete search history.

(56) References Cited

U.S. PATENT DOCUMENTS

| 6,825,657 | B2 | 11/2004 | Kleinberg et al. |
| 2015/0054503 | A1* | 2/2015 | Chen ................... G01R 33/4831 324/303 |
| 2015/0127291 | A1* | 5/2015 | Ying ................... G01R 33/5611 702/104 |

FOREIGN PATENT DOCUMENTS

| CN | 1260497 A | 7/2000 |
| CN | 1510435 A | 7/2004 |

(Continued)

OTHER PUBLICATIONS

The Chinese First Examination Report of corresponding Chinese application No. 201810189339.9 dated Apr. 12, 2019.

*Primary Examiner* — Susan S Lee
(74) *Attorney, Agent, or Firm* — J.C. Patents

(57) ABSTRACT

Provided is a radio frequency antenna receiving method and device for a downhole three-dimensional scanning nuclear magnetic resonance imager. The device comprises: an array antenna for receiving an echo signal, an antenna interface circuit, a receiving and amplifying circuit for amplifying the echo signal, an analog-to-digital conversion circuit, a signal collecting circuit and a control circuit, which are sequentially connected; the array antenna comprises N antenna units, where N≥4; four ports of the control circuit are respectively connected to the antenna interface circuit, the receiving and amplifying circuit, the analog-to-digital conversion circuit and the signal collecting circuit so as to control them, and the control circuit is connected to a logging ground acquisition system; the antenna interface circuit selects one antenna unit in the array antenna. The method and device of the present invention can perform signal detection in a circumferentially multi-directional sensitive region.

10 Claims, 4 Drawing Sheets

(51) Int. Cl.
*H01Q 1/04* (2006.01)
*H01Q 1/52* (2006.01)

(56) References Cited

FOREIGN PATENT DOCUMENTS

| | | |
|---|---|---|
| CN | 105068030 A | 11/2015 |
| CN | 105240002 A | 1/2016 |
| WO | 2016076860 A1 | 5/2016 |

\* cited by examiner

RADIO FREQUENCY ANTENNA RECEIVING METHOD AND DEVICE FOR A DOWNHOLE THREE-DIMENSIONAL SCANNING NUCLEAR MAGNETIC RESONANCE IMAGER

CROSS-REFERENCE TO RELATED APPLICATIONS

This application claims priority to Chinese Patent Application No. 201810189339.9, filed on Mar. 8, 2018, which is hereby incorporated herein by reference in its entirety.

FIELD OF THE TECHNOLOGY

The application relates to a nuclear magnetic resonance logging technology, in particular to a radio frequency antenna receiving method and device for a downhole three-dimensional scanning nuclear magnetic resonance imager.

BACKGROUND

Nuclear Magnetic Resonance (NMR) phenomenon was discovered in 1946 and soon afterwards applied in the fields of physics, chemistry, materials science, life sciences, medicine and the like. In the 1950s, nuclear magnetic resonance began to be used in oil and gas industry, initially used in the field of oil reservoir rock physics. A nuclear magnetic resonance logging tool can detect stratum information around wellbore by using the principle of nuclear magnetic resonance, and has unique qualitative identification and quantitative evaluation capabilities for reservoir fluid.

The nuclear magnetic resonance logging tool forms a static magnetic field for polarizing a spin hydrogen proton by a magnet, and transmits a radio frequency field for reversing the spin hydrogen proton by an antenna. After the radio frequency field is removed, the spin hydrogen proton begins to precession along the static magnetic field and thereby a nuclear magnetic resonance sensing signal is generated, and stratum condition can be analyzed by detecting the nuclear magnetic resonance sensing signal. The existing nuclear magnetic resonance logging tools mostly use columnar magnet, the two ends of the circular surface of the magnet are N pole and S pole respectively. The magnetic field distribution is formed by closed magnetic lines directed from the N pole pointing to the S pole. The antenna surrounds the magnet and can excite polarized stratum region around the wellbore at 360°, so that there is no detection blind region around the wellbore, and a multi-frequency and multi-slice measurement can be performed, but the measured signal can only be an average signal of signals in the 360° stratum.

In summary, the radio frequency antenna receiving device for a nuclear magnetic resonance imager in the prior art can only perform signal detection in a radial depth dimension and an axial depth dimension, and do not have the capability of signal detection for a circumferentially multi-directional sensitive region.

SUMMARY

Embodiments of the present application provide a radio frequency antenna receiving method and device for a downhole three-dimensional scanning nuclear magnetic resonance imager, in order to solve the problem in the art that a radio frequency antenna receiving device for a nuclear magnetic resonance imager does not have the capability of signal detection for a circumferentially multi-directional sensitive region.

In a first aspect, an embodiment of the present invention provides a radio frequency antenna receiving device for a downhole three-dimensional scanning nuclear magnetic resonance imager, including:

an array antenna for receiving a nuclear magnetic resonance echo signal, an antenna interface circuit, a receiving and amplifying circuit for amplifying the echo signal, an analog-to-digital conversion circuit for converting an analog signal into a digital signal, a signal collecting circuit and a control circuit;

the array antenna comprises N antenna units, where N≥4, and the N antenna units correspond to different circumferentially sensitive regions;

the array antenna, the antenna interface circuit, the receiving and amplifying circuit, the analog-to-digital conversion circuit, and the signal collecting circuit are sequentially connected;

four ports of the control circuit are respectively connected to the antenna interface circuit, the receiving and amplifying circuit, the analog-to-digital conversion circuit and the signal collecting circuit, for controlling the antenna interface circuit, the receiving and amplifying circuit, the analog-to-digital conversion circuit and the signal collecting circuit, and the control circuit is connected to a logging ground acquisition system;

the antenna interface circuit is configured to select one antenna unit in the array antenna according to a control instruction of the control circuit.

In a possible implementation, the radio frequency antenna receiving device further includes an isolation circuit, the isolation circuit is connected in series between the antenna interface circuit and the receiving and amplifying circuit, and the isolation circuit is connected to the control circuit;

the isolation circuit is configured to disconnect the connection between the antenna interface circuit and the receiving and amplifying circuit when the array antenna transmits a signal.

In a possible implementation, the radio frequency antenna receiving device further includes a memory for storing signals collected by the signal collecting circuit, the memory is respectively connected to the signal collecting circuit and the control circuit.

In a possible implementation, the radio frequency antenna receiving device further includes a filter circuit, the filter circuit is connected in series between the receiving and amplifying circuit and the analog-to-digital conversion circuit.

In a possible implementation, the antenna interface circuit includes: a selection switch circuit for selecting an antenna unit in the array antenna, a tuning circuit for generating different resonant frequencies, and a coupling circuit for impedance matching;

the selection switch circuit, the tuning circuit and the coupling circuit are sequentially connected;

the selection switch circuit is respectively connected to the array antenna and the control circuit;

the tuning circuit is connected to the control circuit;

the coupling circuit is connected to the receiving and amplifying circuit.

In a possible implementation, the tuning circuit includes a plurality of capacitors in parallel, the tuning circuit controls the capacitances to be connected or disconnected according to a control instruction of the control circuit.

In a possible implementation, the antenna interface circuit further includes a limiting circuit, the limiting circuit includes two diodes, and the two diodes are connected in series between the tuning circuit and the coupling circuit after the two diodes are connected in an anti-parallel manner.

In a possible implementation, the receiving and amplifying circuit includes: a pre-amplifying circuit and a program-controlled amplifying circuit which are sequentially connected, wherein the pre-amplifying circuit is connected to the antenna interface circuit, the program-controlled amplifying circuit is respectively connected to the analog-to-digital conversion circuit and the control circuit;

the pre-amplifying circuit is configured to perform amplification of the echo signal by a fixed multiple; and the program-controlled amplifying circuit is configured to determine an amplification multiple according to a control instruction of the control circuit and an amplitude of the echo signal, and amplify the echo signal according to the determined amplification multiple.

In a second aspect, an embodiment of the present invention provides a radio frequency antenna receiving method for a downhole three-dimensional scanning nuclear magnetic resonance imager, which is applied to the radio frequency antenna receiving device for the downhole three-dimensional scanning nuclear magnetic resonance imager according to any one of the above, including the following steps:

selecting one antenna unit in the array antenna, wherein the array antenna includes N antenna units, where N≥4, and the N antenna units correspond to different circumferentially sensitive regions;

receiving an echo signal in a circumferentially sensitive region corresponding to the one antenna unit.

In a possible implementation, before the receiving an echo signal in a circumferentially sensitive region corresponding to the one antenna unit, the method further includes:

transmitting a signal to the circumferentially sensitive region corresponding to the one antenna unit.

In a third aspect, an embodiment of the present application provides a radio frequency antenna receiving device for a downhole three-dimensional scanning nuclear magnetic resonance imager, the device includes a memory and a processor;

wherein the memory is configured to store computer instructions, and the processor is configured to execute the computer instructions stored in the memory so as to achieve the radio frequency antenna receiving method for the downhole three-dimensional scanning nuclear magnetic resonance imager provided by any embodiment of the second aspect.

In a fourth aspect, an embodiment of the present invention provides a computer readable storage medium, which stores computer instructions, and the computer instructions are used to achieve the radio frequency antenna receiving method for the downhole three-dimensional scanning nuclear magnetic resonance imager provided by any embodiment of the second aspect.

In the radio frequency antenna receiving method and device for a downhole three-dimensional scanning nuclear magnetic resonance imager provided in embodiments of the present invention, by selecting one antenna unit in an array antenna to receive an echo signal in a circumferentially sensitive region corresponding to the antenna unit, and by switching different antenna units in the array antenna to receive echo signals in a circumferentially multi-directional sensitive region, signal detection for circumferentially multi-directional sensitive regions is realized, which solves the problem in the prior art that a radio frequency antenna receiving device for a nuclear magnetic resonance imager does not have the capability of signal detection for a circumferentially multi-directional sensitive region.

BRIEF DESCRIPTION OF THE DRAWINGS

The drawings herein are incorporated into the description and constitute a part of the description, and the drawings illustrate the embodiments of the present invention, and are used to explain the principle of the present invention together with the description.

Specific embodiments of the present invention have been shown through the foregoing drawings and are described in detail below. The drawings and word descriptions are not intended to limit the scope of the present invention in any way, but to describe the concept of the present invention for those skilled in the art by referring to the specific embodiments.

DETAILED DESCRIPTION

Exemplary embodiments will be described in detail herein, which are shown in the accompanying drawings. When the following descriptions refer to the drawings, the same figure in different drawings represents the same or similar elements, unless otherwise indicated. The embodiments described in the following exemplary embodiments do not represent all embodiments consistent with the present invention. Instead, they are merely embodiments of devices and methods consistent with some aspects of the invention as detailed in the appended claims.

The terms "including", "having" and any variations thereof in the description of the present invention and claims are intended to cover a non-exclusive inclusion. For example, a process, method, system, product, or device including a series of steps or units is not limited to the listed steps or units, but optionally also includes steps or units not listed, or, optionally also comprises other steps or units inherent to these processes, methods, products or device.

The "one embodiment" or "an embodiment" referred to throughout the specification of the present invention means that a particular feature, structure, or characteristic relating to embodiments is included in at least one embodiment of the present invention. Thus, "in one embodiment" or "in an embodiment" throughout the specification may not necessarily refer to the same embodiment. It should be noted that the embodiments of the present invention and features of the embodiments may be combined with each other when there is no conflict.

Figure 1:
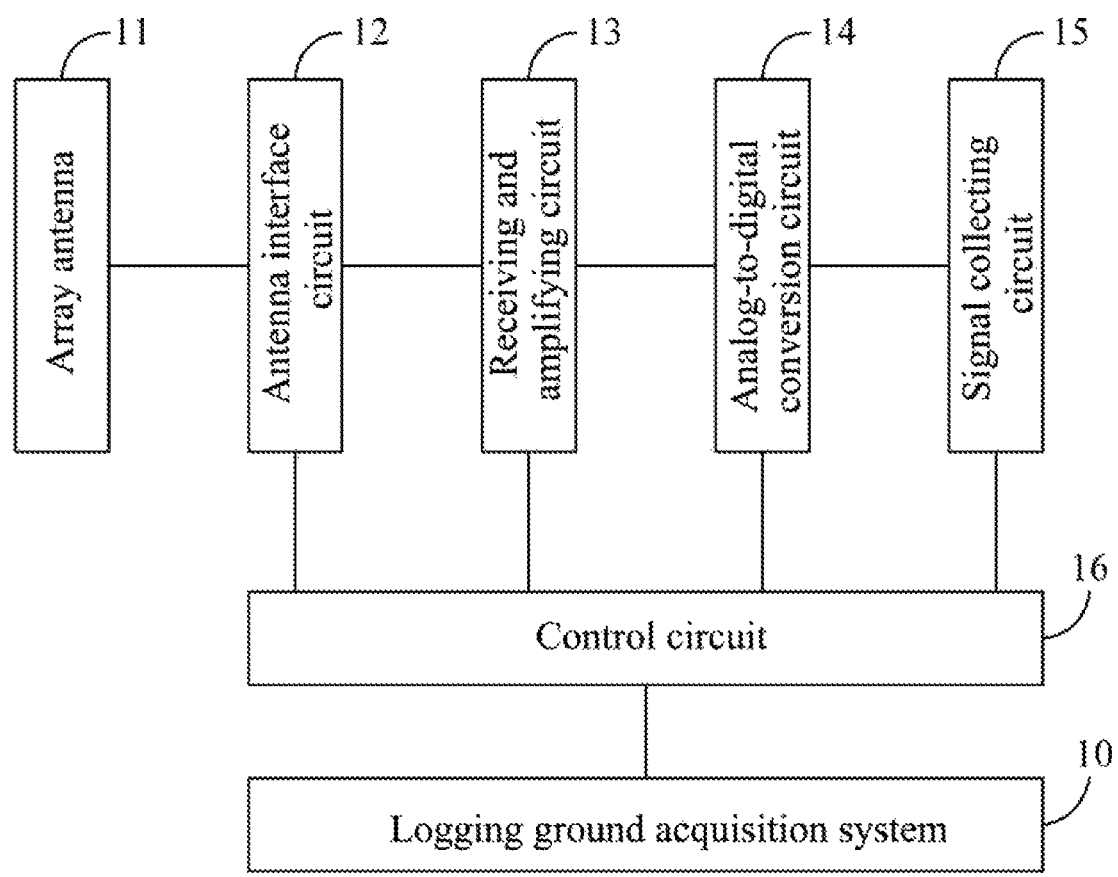
FIG. 1 is a structure schematic diagram of an embodiment of a radio frequency antenna receiving device for a downhole three-dimensional scanning nuclear magnetic resonance imager according to the present invention.

FIG. 1 is a structure schematic diagram of an embodiment of a radio frequency antenna receiving device for a downhole three-dimensional scanning nuclear magnetic resonance imager according to the present invention. As shown in FIG. 1, the device may includes: an array antenna 11, an antenna interface circuit 12, a receiving and amplifying circuit 13, an analog-to-digital conversion circuit 14, a signal collecting circuit 15, and a control circuit 16.

The array antenna 11, the antenna interface circuit 12, the receiving and amplifying circuit 13, the analog-to-digital conversion circuit 14 and the signal collecting circuit 15 are sequentially connected. Four ports of the control circuit 16 are respectively connected to the antenna interface circuit 12, the receiving and amplifying circuit 13, the analog-to-digital conversion circuit 14, and the signal collecting circuit 15, so as to control the antenna interface circuit 12, the receiving and amplifying circuit 13, the analog-to-digital conversion circuit 14, and the signal collecting circuit 15. The control circuit 16 is connected to a logging ground acquisition system 10.

A nuclear magnetic resonance imager performs nuclear magnetic resonance logging by analyzing a received nuclear magnetic resonance echo signal reflected back. In this embodiment, the array antenna 11 is used to receive the nuclear magnetic resonance echo signal. The array antenna 11 in the embodiment includes N antenna units, where N≥4, and the N antenna units correspond to different circumferentially sensitive regions, and thus echo signals in different circumferentially sensitive regions can be collected by utilizing circumferential sensibility of the antenna units.

In general, the more antenna units the array antenna includes, the higher the circumferential sensitivity. For an uniformly distributed array antenna, that is, the size of the circumferential region corresponding to each antenna unit is the same, the circumferential sensitivity can be expressed as 360°/N. Taking an array antenna including four antenna units as an example, antenna unit No. 1 can correspond to a circumferential 0-90° region, antenna unit No. 2 can correspond to a circumferential 90-180° region, antenna unit No. 3 can corresponds to a circumferential 180~270° region, and antenna unit No. 4 can correspond to a circumferential 270-360° region. Certainly, the antenna units may also be distributed in an uneven manner, that is, sizes of the circumferential regions corresponding to each antenna unit are different. The number, the layout, and the specific positional relationship with a magnet, of antenna units included in the array antenna can be set according to actual needs. The embodiment does not specifically limit them.

The antenna interface circuit 12 in the embodiment selects one antenna unit in the array antenna 11 according to a control instruction of the control circuit 16, for receiving a nuclear magnetic resonance echo signal in the circumferentially sensitive region corresponding to the antenna unit. For example, when the control instruction of the control circuit 16 indicates receiving a signal in the circumferential 90-180° region, the antenna interface circuit 12 can select antenna unit No. 2 in the array antenna 11 according to the instruction, for receiving the signal. The embodiment does not limit the specific implementation manner of the antenna interface circuit. For example, a switch selection circuit having N-select-1 function can be used.

The echo signal received by the antenna unit in the array antenna 11 is usually weak and cannot meet the signal amplitude requirements of the subsequent circuit in the receiving device. Therefore, in the present embodiment, the receiving and amplifying circuit 13 is used to amplify the received weak echo signal to achieve amplitude matching between the signal and the digital circuit so as to meet the subsequent need for correlated processing of the signal. The amplitudes of echo signals of different radial depth dimensions have a large difference. The receiving and amplifying circuit 13 in the embodiment can adopt different amplification strategies for signals having different amplitudes or different frequencies according to the control instruction of the control circuit 16. For example, a small signal is amplified by a larger multiple and a large signal is amplified by a smaller multiple. Different resonant frequencies are usually used for detection of different radial depths, so different amplification strategies can also be used according to difference in frequency.

Since a digital signal has many advantages that analog signals cannot compare thereto, therefore, the analog-to-digital conversion circuit 14 is used in the embodiment to convert an analog signal into a digital signal according to the control instruction of the control circuit 16, so that the signal is subsequently processed by a digital signal processing method. The embodiment does not limit the specific implementation of the analog-to-digital conversion circuit 14.

The signal collecting circuit 15 processes a digital signal output from the analog-to-digital conversion circuit 14, extracts a useful signal and transmits it to the control circuit 16, the control circuit 16 transmits the collected signal to the logging ground acquisition system 10 connected thereto for analysis.

It should be noted that the logging ground acquisition system 10, also called as a host computer, is not part of the receiving device provided by the embodiment, and may be implemented by a computer having control function and data analysis capability, or may be implemented by other special device. The embodiment does not limit its specific implementation. The logging ground acquisition system 10 can be connected to the control circuit 16 by using a serial communication bus, such as a CAN bus, or can be connected to the control circuit 16 in a wireless manner, sends a control instruction to the control circuit 16, and acquires a collected signal from the control circuit 16 for analysis.

The control circuit 16 in the embodiment has a bridge function of uploading and releasing, receiving an instruction from the logging ground acquisition system 10, and converting it into a corresponding control instruction, so as to control the antenna interface circuit 12, the receiving and amplifying circuit 13, the analog-to-digital conversion circuit 14 and signal collecting circuit 15, respectively. The control circuit 16 also transmits a useful signal extracted from the signal collecting circuit 15 to the logging ground acquisition system 10.

A specific embodiment will be used to illustrate how the receiving device provided by the embodiment receives a signal. The specific data is for illustrative purposes only and does not limit the invention.

For example, in order to detect information on a stratum at an axial depth of 1000 m, a radial depth of 50 cm, and a circumference of 0 to 90°. Firstly, the receiving device provided in the embodiment shall be placed in downhole at 1000 meters, and a corresponding signal is transmitted before receiving a signal. The frequency of the transmitted signal is adjusted to match with the radial depth of 50 cm, and an omnidirectional antenna can be used to transmit the signal to a circumferential 360° region, or the array antenna in the device of the embodiment can be shared in a time sharing multiplexing manner to transmit the signal. The embodiment does not limit the transmitting part.

The logging ground acquisition system 10 sends an instruction to the control circuit 16 to receive a circumferential 0~90° signal. The control circuit 16 generates corresponding control information according to the instruction, and controls the antenna interface circuit 12 to select antenna unit No. 1 corresponding to circumferential 0~90° to receive the signal. The receiving and amplifying circuit 13 performs amplification on the received weak echo signal according to its amplitude, so as to achieve amplitude matching between the signal and digital circuit. The analog-to-digital conversion circuit 14 converts the amplified analog echo signal into a digital signal, so that the signal collecting circuit 15 performs digital signal processing thereon to complete signal collection. The control circuit 16 transmits the received signal collected by the signal collecting circuit 15 to the logging ground acquisition system 10, and the logging ground acquisition system 10 analyzes the received signal to obtain stratum information at corresponding location.

The radio frequency antenna receiving device of the downhole three-dimensional scanning nuclear magnetic resonance imager provided in the embodiment realizes signal detection in a circumferentially multi-directional sensitive region by selecting one antenna unit in the array antenna by the antenna interface circuit according to the control instruction of the control circuit, and receiving a echo signal in a circumferentially sensitive region corresponding to the antenna unit by the antenna unit, and receiving echo signals in different circumferential regions by switching different antenna units, so that the receiving device provided in the embodiment has three-dimensional signal detection capability of axial depth dimension, radial depth dimension and circumferential depth dimension. The receiving device provided in the embodiment has only one antenna unit for receiving a signal at the same time. By adopting a single group receiving channel, the internal space of the device can be effectively reduced and the axial dimension of the device can be shortened, which facilitates the device to be used in an actual environment.

When nuclear magnetic resonance logging is used, the device needs to be placed underground for work, so the requirements for volume, weight and energy consumption of the device are more stringent. Optionally, transmission and reception of the magnetic resonance imager share the array antenna and the antenna interface circuit in a time sharing multiplexing manner to meet the requirements for volume, weight, energy consumption, etc. When transmitting a signal, a generated high voltage pulse signal may cause damage to the receiving and amplifying circuit in the receiving device. Therefore, on the basis of the above embodiments, the radio frequency antenna receiving device for the downhole three-dimensional scanning nuclear magnetic resonance imager provided by the present embodiment further includes an isolation circuit, and the isolation circuit is connected in series between the antenna interface circuit and the receiving and amplifying circuit. The isolation circuit is further connected to the control circuit, and receives the control instruction of the control circuit. The antenna interface circuit and the receiving and amplifying circuit are kept in connection only when the receiving device receives a signal. In other cases, for example, when transmitting a signal, the antenna interface circuit and the receiving and amplifying circuit are disconnected to prevent a high-voltage pulse signal generated when the signal is transmitted from entering and damaging the receiving and amplifying circuit, so as to form protection for the receiving device. The embodiment does not limit the specific implementation form of the isolation circuit. For example, it can be implemented by using a switching circuit.

The radio frequency antenna receiving device for the nuclear magnetic resonance imager is placed in a well in use, and is limited by space and connection resources. It may communicate with a host computer through a serial communication bus. Although the real-time requirement of the nuclear magnetic resonance logging is not high, in order to avoid the loss of collected signals due to mismatching between signal transmission rate and the signal collecting rate, the radio frequency antenna receiving device for the downhole three-dimensional scanning nuclear magnetic resonance imager provided in the present embodiment, based on the above embodiments, may further include a memory connected to the signal collecting circuit for storing signals collected by the signal collecting circuit. When there are sufficient communication resources for transmitting signals, the control circuit reads the stored signals from the memory and transmits them to the host computer located above the well. In a possible implementation, the host computer also can directly reads the collected signals from the memory after the receiving device is taken out from the downhole when all signal detection works are completed.

On the basis of the above embodiments, the radio frequency antenna receiving device for the downhole three-dimensional scanning nuclear magnetic resonance imager provided in the embodiment may further include a filter circuit, and the filter circuit is connected in series between the receiving and amplifying circuit and the analog-to-digital conversion circuit and is used to filter an amplified echo signal to filter out clutter that may affect subsequent signal analysis, such as noise.

Figure 2:
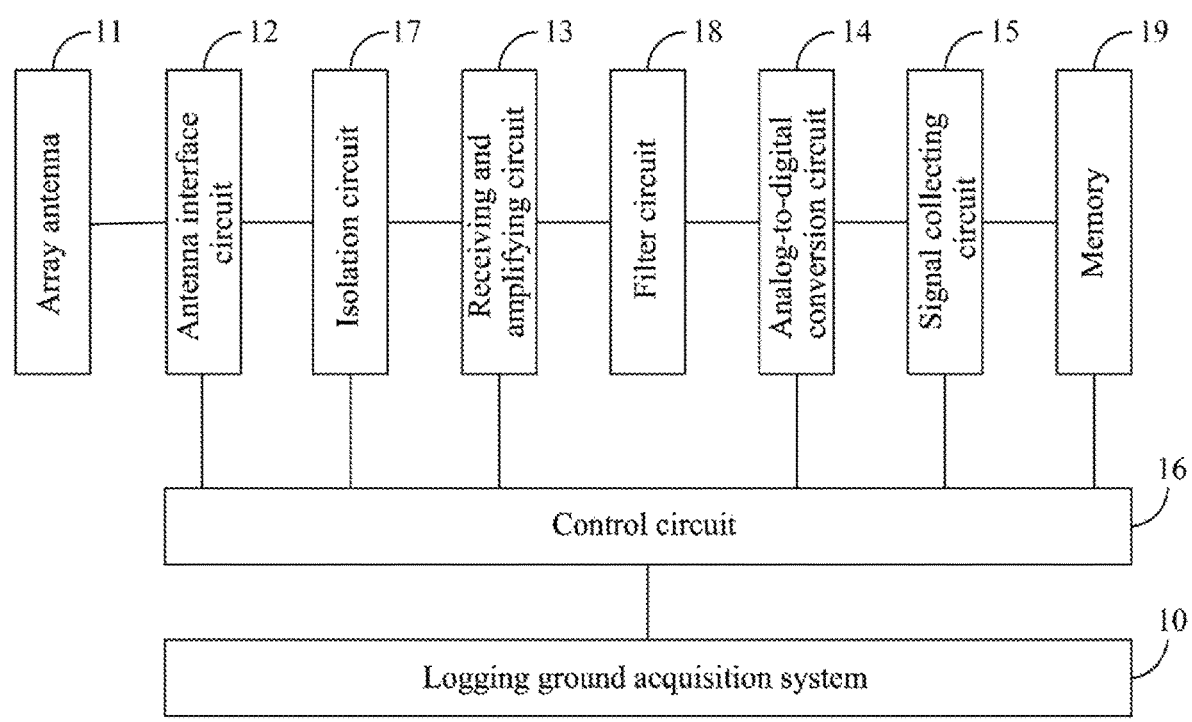
FIG. 2 is a structure schematic diagram of another embodiment of a radio frequency antenna receiving device for a downhole three-dimensional scanning nuclear magnetic resonance imager according to the present invention.

On the basis of the foregoing embodiments, the present embodiment combines the foregoing embodiments, and the present embodiment is only a possible combination manner, and there are also other combination manners. FIG. 2 is a structure schematic diagram of another embodiment of a radio frequency antenna receiving device for a downhole three-dimensional scanning nuclear magnetic resonance imager according to the present invention. As shown in FIG. 2, the device includes: an array antenna 11, an antenna interface circuit 12, a receiving and amplifying circuit 13, an analog-to-digital conversion circuit 14, a signal collecting circuit 15, a control circuit 16, an isolation circuit 17, a filter circuit 18, and a memory 19.

The array antenna 11, the antenna interface circuit 12, the isolation circuit 17, the receiving and amplifying circuit 13, the filter circuit 18, the analog-to-digital conversion circuit 14, the signal collecting circuit 15 and the memory 19 are sequentially connected. Six ports of the control circuit 16 are respectively connected to the antenna interface circuit 12, the isolation circuit 17, the receiving and amplifying circuit 13, the analog-to-digital conversion circuit 14, the signal collecting circuit 15 and the memory 19, for controlling the antenna interface circuit 12, the isolation circuit 17, the receiving and amplifying circuit 13, the analog-to-digital conversion circuit 14, the signal collecting circuit 15 and the memory 19. The control circuit 16 is connected to a logging ground acquisition system 10.

Specific implementation manner of each circuit in this embodiment may refer to the foregoing embodiments, and details are not described here again.

Figure 3:
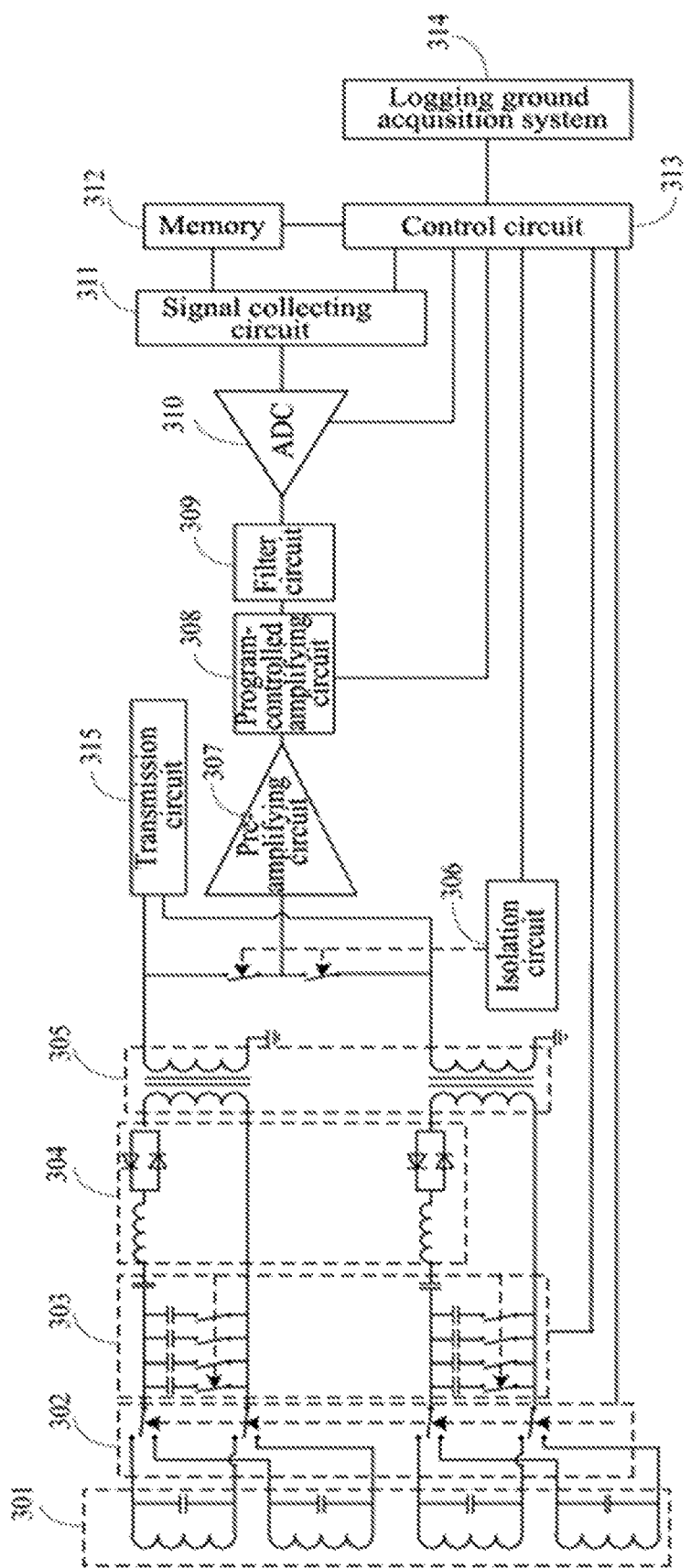
FIG. 3 is a structure schematic diagram of still another embodiment of a radio frequency antenna receiving device for a downhole three-dimensional scanning nuclear magnetic resonance imager according to the present invention.

The receiving device provided by the present invention will be described in detail below by using a specific embodiment. FIG. 3 is a structure schematic diagram of another embodiment of a radio frequency antenna receiving device for a downhole three-dimensional scanning nuclear magnetic resonance imager according to the present invention. As shown in FIG. 3, the device includes: an array antenna 301, a selection switch circuit 302, a tuning circuit 303, a limiting circuit 304, a coupling circuit 305, an isolation circuit 306, a pre-amplifying circuit 307, a program-controlled amplifying circuit 308, a filter circuit 309, an analog-to-digital conversion circuit 310, a signal collecting circuit 311, a memory 312, and a control circuit 313.

The antenna interface circuit in this embodiment may include a selection switch circuit 302 for selecting an antenna unit in the array antenna, a tuning circuit 303 for generating different resonant frequencies, and a coupling circuit 305 for impedance matching.

The selection switch circuit 302, the tuning circuit 303 and the coupling circuit 305 are sequentially connected. The selection switch circuit 302 is respectively connected to the array antenna 301 and the control circuit 313, the tuning circuit 303 is connected to the control circuit 313, and the coupling circuit 305 is connected to the receiving and amplifying circuit.

In a possible implementation, the antenna interface circuit in this embodiment may further include a limiting circuit 304. The limiting circuit 304 includes two diodes, and the two diodes are connected in series between the tuning circuit 303 and the coupling circuit 305 after the two diodes are connected in an anti-parallel manner, so as to limit the voltage amplitude input into the pre-amplifying circuit 307 to protect the pre-amplifying circuit.

The receiving and amplifying circuit in this embodiment may include: the pre-amplifying circuit 307 and the program-controlled amplifying circuit 308 which are sequentially connected, the pre-amplifying circuit 307 is connected to the antenna interface circuit, and the program-controlled amplifying circuit 308 is respectively connected to the filter circuit 309 and the control circuit 313.

The pre-amplifying circuit 307 is configured to identify a small signal and perform amplification of an echo signal by a fixed multiple. The program-controlled amplifying circuit 308 is configured to determine an amplification multiple according to a control instruction of the control circuit 313 and an amplitude of the echo signal, and amplify the echo signal according to the determined amplification multiple.

The tuning circuit 303 in this embodiment may include a plurality of capacitors connected in parallel, and the tuning circuit 303 controls the capacitors to be connected or disconnected according to a control instruction of the control circuit 313, so as to change the capacitance value accessed to the circuit, so as to change resonant frequency and thereby to perform signal detection in different radial depth dimensions. This embodiment does not impose any particular limitation on the number and size of the capacitors. A capacitor can also be connected in series after the plurality of capacitors are connected in parallel.

The array antenna 301 in this embodiment includes four evenly distributed antenna units, which are selected by the selection switch circuit 302, so that only one antenna unit is connected to the circuit at the same time to receive a signal in a 90° circumferentially sensitive region. As shown in FIG. 3, a transmission circuit 315 and the receiving device provided in this embodiment share the antenna interface circuit and the array antenna in a time sharing multiplexing manner. Since a high voltage pulse signal is generated when a signal is transmitted, the selection switch circuit in this embodiment is required to withstand a high voltage and a large current. The coupling circuit 305 in this embodiment amplifies a transmission voltage when the transmission circuit 315 transmits a signal, and performs impedance matching when receiving the signal.

The radio frequency antenna receiving device for the downhole three-dimensional scanning nuclear magnetic resonance imager provided by the embodiment has a capability of signal detection in a 90° circumferentially sensitive region, and the signal detection in a circumferentially multi-directional sensitive region can be realized by switching different antenna units.

Figure 4:
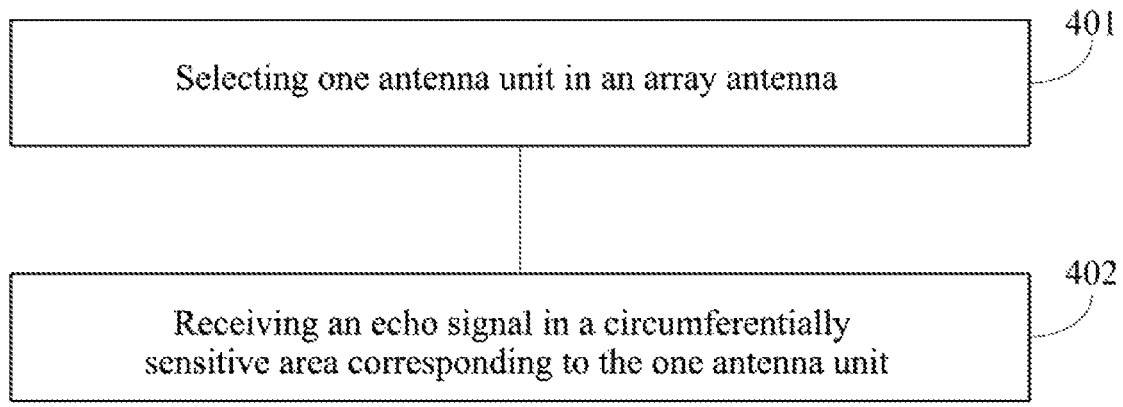
FIG. 4 is a flow diagram of an embodiment of a radio frequency antenna receiving method for a downhole three-dimensional scanning nuclear magnetic resonance imager according to the present invention.

The embodiment of the present invention further provides a radio frequency antenna receiving method for a downhole three-dimensional scanning nuclear magnetic resonance imager, the method may be applied to the radio frequency antenna receiving device for the downhole three-dimensional scanning nuclear magnetic resonance imager provided by any one of the above embodiments, or may be used independent from the above device. FIG. 4 is a flow diagram of an embodiment of a radio frequency antenna receiving method for a downhole three-dimensional scanning nuclear magnetic resonance imager according to the present invention. As shown in FIG. 4, the method includes the following steps:

Step 401: selecting one antenna unit in an array antenna.

The array antenna in this embodiment includes N antenna units, where N≥4, and N antenna units correspond to different circumferentially sensitive regions. By selecting an antenna unit, a circumferential direction is selected.

Step 402: receiving an echo signal in a circumferentially sensitive region corresponding to the one antenna unit.

The radio frequency antenna receiving method for a downhole three-dimensional scanning nuclear magnetic resonance imager provided in this embodiment realizes signal detection for a circumferentially multi-directional sensitive region by selecting one antenna unit in the array antenna, and receiving by using the antenna unit an echo signal in a circumferentially sensitive region corresponding to the antenna unit.

In a possible implementation, before the receiving an echo signal in a circumferentially sensitive region corresponding to the one antenna unit, the method further includes:

transmitting a signal to the circumferentially sensitive region corresponding to the one antenna unit.

The radio frequency antenna receiving method for the downhole three-dimensional scanning nuclear magnetic resonance imager provided by the embodiment can save the power consumption for transmitting a signal by directionally transmitting the signal, and can realize signal detection for a circumferentially multi-directional sensitive region by using the antenna unit for directionally receiving the signal.

Figure 5:
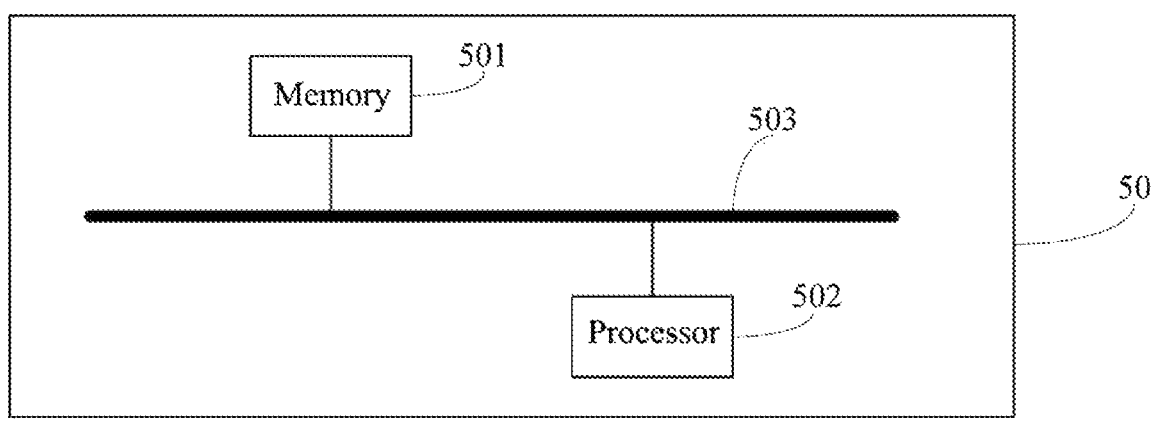
FIG. 5 is a structure schematic diagram of yet another embodiment of a radio frequency antenna receiving device for a downhole three-dimensional scanning nuclear magnetic resonance imager according to the present invention.

FIG. 5 is a structure schematic diagram of yet another embodiment of a radio frequency antenna receiving device for a downhole three-dimensional scanning nuclear magnetic resonance imager according to the present invention. As shown in FIG. 5, the device 50 includes: a memory 501, a processor 502, and a bus 503.

The memory 501 is configured to store computer instructions, and the processor 502 is configured to execute the computer instructions stored in the memory 501 to implement the technical solution of the method embodiment shown in FIG. 4. The bus 503 is configured to implement the connection between the components.

An embodiment of the present invention further provides a computer readable storage medium, which stores computer instructions, the computer instructions are used to implement the technical solutions of the above-mentioned embodiments of the radio frequency antenna receiving method for a downhole three-dimensional scanning nuclear magnetic resonance imager.

It will be understood by those skilled in the art that all or part of the steps for implementing the above method may be performed by hardware related to program instructions. The aforementioned program can be stored in a computer readable storage medium. When the program is executed, it includes executing steps of the foregoing method embodiments; and the foregoing storage medium includes various media that can store program codes, such as ROM, RAM, a magnetic disk, or an optical disk.

Finally, it should be noted that the above embodiments are merely illustrate the technical solutions of the present invention, and are not intended to limit the present invention; although the present invention has been described in detail with reference to the foregoing embodiments, the skilled in the art will understand that the technical solutions described in the foregoing embodiments may be modified, or some or all of the technical features therein may be equivalently replaced; and these modifications or replacements do not make the essence of the corresponding technical solutions depart from the scope of the technical solutions of the embodiments of the present invention.

What is claimed is:

1. A radio frequency antenna receiving device for a downhole three-dimensional scanning nuclear magnetic resonance imager, comprising:
    an array antenna for receiving a nuclear magnetic resonance echo signal, an antenna interface circuit, a receiving and amplifying circuit for amplifying the echo signal, an analog-to-digital conversion circuit for converting an analog signal to a digital signal, a signal collecting circuit and a control circuit; wherein
    the array antenna comprises N antenna units, where N≥4, and the N antenna units correspond to different circumferentially sensitive regions;
    the array antenna, the antenna interface circuit, the receiving and amplifying circuit, the analog-to-digital conversion circuit, and the signal collecting circuit are sequentially connected;
    four ports of the control circuit are respectively connected to the antenna interface circuit, the receiving and amplifying circuit, the analog-to-digital conversion circuit and the signal collecting circuit, for controlling the antenna interface circuit, the receiving and amplifying circuit, the analog-to-digital conversion circuit and the signal collecting circuit, and the control circuit is connected to a logging ground acquisition system; and
    the antenna interface circuit is configured to select one antenna unit in the array antenna according to a control instruction of the control circuit.

2. The device according to claim 1, further comprising an isolation circuit, wherein the isolation circuit is connected in series between the antenna interface circuit and the receiving and amplifying circuit, and the isolation circuit is connected to the control circuit; and
    the isolation circuit is configured to disconnect the connection between the antenna interface circuit and the receiving and amplifying circuit when the array antenna transmits a signal.

3. The device according to claim 1, further comprising a memory for storing signals collected by the signal collecting circuit, the memory being respectively connected to the signal collecting circuit and the control circuit.

4. The device according to claim 1, further comprising a filter circuit, the filter circuit being connected in series between the receiving and amplifying circuit and the analog-to-digital conversion circuit.

5. The device according to claim 1, wherein the antenna interface circuit comprises: a selection switch circuit for selecting an antenna unit in the array antenna, a tuning circuit for generating different resonant frequencies, and a coupling circuit for impedance matching; wherein
    the selection switch circuit, the tuning circuit and the coupling circuit are sequentially connected;
    the selection switch circuit is respectively connected to the array antenna and the control circuit;
    the tuning circuit is connected to the control circuit; and
    the coupling circuit is coupled to the receiving and amplifying circuit.

6. The device according to claim 5, wherein the tuning circuit comprises a plurality of capacitors in parallel, and the tuning circuit controls the capacitors to be connected or disconnected according to a control instruction of the control circuit.

7. The device according to claim 5, wherein the antenna interface circuit further comprises a limiting circuit, the limiting circuit comprises two diodes, and the two diodes are connected in series between the tuning circuit and the coupling circuit after the two diodes are connected in an anti-parallel manner.

8. The device according to claim 1, wherein the receiving and amplifying circuit comprises: a pre-amplifying circuit and a program-controlled amplifying circuit which are sequentially connected, wherein the pre-amplifying circuit is connected to the antenna interface circuit, and the program-controlled amplifying circuit is respectively connected to the analog-to-digital conversion circuit and the control circuit;
    the pre-amplifying circuit is configured to perform amplification on the echo signal by a fixed multiple; and
    the program-controlled amplifying circuit is configured to determine a amplification multiple according to a control instruction of the control circuit and an amplitude of the echo signal, and amplify the echo signal according to the determined amplification multiple.

9. A radio frequency antenna receiving method for a downhole three-dimensional scanning nuclear magnetic resonance imager, which is applied to the radio frequency antenna receiving device for a downhole three-dimensional scanning nuclear magnetic resonance imager according to claim 1, comprising the following steps:
    selecting one antenna unit in an array antenna, wherein the array antenna comprises N antenna units, where N≥4, and the N antenna units correspond to different circumferentially sensitive regions; and
    receiving an echo signal in a circumferentially sensitive region corresponding to the one antenna unit.

10. The method according to claim 9, wherein before the receiving an echo signal in a circumferentially sensitive region corresponding to the one antenna unit, the method further comprises:
    transmitting a signal to the circumferentially sensitive region corresponding to the one antenna unit.

* * * * *